United States Patent [19]
Lee

[11] Patent Number: 5,590,445
[45] Date of Patent: Jan. 7, 1997

[54] TAPE EXTENSION DEVICE FOR SEMICONDUCTOR PRODUCING APPARATUS AND SEMICONDUCTOR PRODUCING APPARATUS WITH TAPE EXTENSION DEVICE

[75] Inventor: Masahiro Lee, Sakai, Japan

[73] Assignee: Teikoku Seiki Kabushiki Kaisha, Osaka, Japan

[21] Appl. No.: 249,770

[22] Filed: May 26, 1994

[30] Foreign Application Priority Data

Mar. 22, 1994 [JP] Japan .................. 6-076542

[51] Int. Cl.$^6$ .......................................... D06C 3/00
[52] U.S. Cl. .......................... 26/51; 26/72; 26/88
[58] Field of Search .................. 26/51, 71, 72, 26/88, 97, 98, 99, 91, 93, 94, 52; 264/288.4, 289.3, 290.2; 226/149, 162, 163, 165; 437/924, 925, 209, 211, 212, 12

[56] References Cited

U.S. PATENT DOCUMENTS

| | | | |
|---|---|---|---|
| 2,006,814 | 7/1935 | Payet | 26/72 |
| 2,334,022 | 11/1943 | Minich | 26/72 |
| 2,482,270 | 9/1949 | Grundy | 26/72 |
| 2,866,231 | 12/1958 | Vaughan | 26/72 |
| 3,014,234 | 12/1961 | Koppehele | 26/72 |
| 3,078,504 | 2/1963 | Koppehele | 26/98 |
| 3,124,834 | 3/1964 | Vandierendonck | 26/88 |
| 3,132,375 | 5/1964 | Koppehele | 26/88 |
| 3,193,873 | 7/1965 | Wienand | 26/72 |
| 3,243,844 | 4/1966 | Nash | 26/72 |
| 3,248,753 | 5/1966 | Kobayashi et al. | 26/72 |
| 3,268,142 | 8/1966 | Macomson | 26/72 |
| 3,323,703 | 6/1967 | Wibbing et al. | 26/88 |
| 3,727,273 | 4/1973 | Hyatt et al. | 26/91 |
| 5,106,450 | 4/1992 | Freisitzer et al. | 156/517 |
| 5,285,943 | 2/1994 | Sato | 226/149 |
| 5,355,564 | 10/1994 | Gunter, Jr. et al. | 26/93 |

FOREIGN PATENT DOCUMENTS 2245306  3/1974  Germany ...................... 26/88

*Primary Examiner*—Amy B. Vanatta
*Attorney, Agent, or Firm*—Edwin E. Greigg; Ronald E. Greigg

[57] ABSTRACT

In a tape extension device for a semiconductor producing apparatus having a vertical tension device for tensing a tape, which is withdrawn from a tape roller, in a down-web direction above a semiconductor wafer, the tape extension device in the present invention comprises a lateral tension device. The lateral tension device includes clamp means for clamping an edge of a side of the tape in a cross-web direction which tape is extended in the down-web direction by means of the vertical tension device, another clamp means for clamping another edge of the tape, and drive means for opening and closing both of the clamp means in the cross-web direction.

26 Claims, 3 Drawing Sheets

TAPE EXTENSION DEVICE FOR SEMICONDUCTOR PRODUCING APPARATUS AND SEMICONDUCTOR PRODUCING APPARATUS WITH TAPE EXTENSION DEVICE

BACKGROUND OF THE INVENTION (1) Field of the invention

The present invention relates to a tape extension device for a semiconductor producing apparatus and particularly to a tape extension device for a semiconductor producing apparatus which may average a tension force in two dimensions so as to extend the tape, and particularly to the semiconductor producing apparatus having such a tape extension device.

(2) (Prior Art)

In semiconductor producing processes, where a number of semiconductor chips are made by cutting a semiconductor wafer, prior to a cutting process, a tape is applied from a surface of the semiconductor wafer having a semiconductor connecting construction on another surface thereof, to a plate-like die frame which surrounds a periphery of the semiconductor wafer, in order to direct the semiconductor wafer precisely and simplify treatment of the semiconductor chips which are cut off from the semiconductor wafer.

As a method of applying the tape to the semiconductor wafer and the frame, for example, it uses such a method comprising the steps of tensing the tape above the semiconductor wafer and the plate-like frame surrounding the semiconductor wafer coaxially in order to prevent the tape from wrinkling, lifting the frame and the semiconductor wafer to the undersurface of the tape thereafter, pressing the tape onto the frame and the semiconductor wafer by means of for example a roller, and cutting off a part of the tape covering the frame and the semiconductor wafer.

For example, as shown in FIG. 5, the tape tension device for tensing the tape is arranged such that a fixed position roller and a movable roller 104 are positioned above a semiconductor wafer 101 and a frame 102 leaving a suitable distance in a down-web direction.

The fixed position roller and the movable roller 104 are positioned parallelly on the same level so as to be rotatable about a horizontal axis.

A counter roller 105 is arranged on an opposite side to the movable roller 104 of the fixed position roller 103 so as to be able to contact with and depart from the fixed position roller 103. A clamp pad 106 is arranged on an opposite side to the fixed position roller 104 of the movable roller 104 so as to be able to contact with and depart from the movable roller 104, and a drum roller 107, which is formed to have a small diameter at a middle portion thereof, is positioned above the fixed position roller 104.

The movable roller 104, the drum roller 107, the clamp pad 106 and a cylinder 108 for driving the clamp pad 106 are driven by means of a driving device 109 in a down-web direction, namely, a direction of transferring a tape 110 (the direction of flow of the tape).

The driving device 109 may sometimes be constructed by means of an air-cylinder, but in this case it is constructed as follows. In order to control a tension force of the tape 110 by adjusting an amount of movement of each of the moving roller 104 and the clamp pad 106, the moving roller 104 and the cylinder 108 are supported by a moving frame 111. The driving device 109 comprises a screw shaft 112 which is screwed into a screw hole formed with the moving frame 111 in such a state that the screw shaft is rotated and moved in the down-web direction, and a stepping motor 113 which drives the screw shaft 112.

The tape 110, which is drawn from a tape roll 114, goes through between the fixed position roller 103 and the counter roller 105, and then laterally goes from the underside of the fixed position roller 103 to the underside of the moving roller 104. Thereafter, the tape 110 goes through between the moving roller 104 and the clamp pad 106 and rides on the drum roller 107, and then the tape is wound on a winding roller 115.

The tape 110 is spread in a cross-web direction as it rides on the drum roller 107, so that the tape 110 can be extended on the semiconductor wafer and the frame 102 without wrinkles.

After suitable portions of the tape 110 are clamped by the fixed position roller 103 and the counter roller 105, the moving roller 104 and the clamp pad 106 clamp the tape 110. Then, the moving roller 104, the drum roller 107, the clamp pad 106 and the cylinder 108 are moved respectively for a predetermined distance in a direction which is remote from the fixed position roller 103, so that a tension force of for example 50~80 Kg. may be given to a part of the tape 110 between the fixed position roller 103 and the moving roller 104.

Thereafter, the semiconductor wafer 101 and the frame 102 are lifted and applied to the tape 110 and a part of the tape 110 covering the inner periphery of the frame 102 and the semiconductor wafer 110 is cut off, and then the semiconductor wafer 101 and the frame 102 having the tape 110 are moved downwards.

After the step, the counter roller 105 is separated from the fixed position roller 103 and the clamp pad 106 is also separated from the moving roller 104, and then the tape 110 is wound for a predetermined length while the moving roller 104 is returned to its original position.

Repeating a series of these steps, application of the tape 110 to the semiconductor wafer 101 and the frame 102 can be repeated in order.

According to the conventional tape extension device, the tension force in the cross-web direction given to the tape 110 by means of the drum roller 107 shares about 5% of the tension force in the down-web direction, which may just smooth away the tape 110.

When the semiconductor wafer 101 is cut off in a die-cutting process after the tape 110 is applied thereto, each of the intervals between semiconductor chips cut from the semiconductor wafer 101, becomes uneven. As the result, it becomes impossible to detect positions of the semiconductor chips when the semiconductor chips are peeled off from the tape 110 and removed by means of a pick-up machine. Therefore, it frequently happened that the pick-up machine is stopped automatically and its producing lines is interrupted.

SUMMARY OF THE INVENTION

The present invention has been achieved for solving the above-mentioned technical theme and has an object for providing a tape extension device for a semiconductor producing apparatus and the semiconductor producing apparatus having the tape extension device which may tense a tape, which is applied to a semiconductor wafer and also to a frame, in a cross-web direction as it is extended in a down-web direction.

The present invention has the following means for solving the above object in a tape extension device for a semiconductor producing apparatus having a vertical tension device for extending a tape, which is withdrawn from a tape roller, in a down-web direction above a semiconductor wafer.

Namely, the present invention provides a lateral tension device comprising clamp means for clamping an edge of a side of the tape in a cross-web direction which tape is extended in a down-web direction by means of the vertical extension device, another clamp means for clamping another edge of the tape, and drive means for opening and closing both of the clamp means in a cross-web direction.

Since the present invention provides the above-mentioned elements, it functions as follows:

The vertical tension device gives a tension force in the down web direction to the tape and the lateral tension device gives a tension force in the cross-web direction to the tape, said tension force of the cross-web direction being substantially equal to the tension force of the down-web direction. Thereafter, the semiconductor wafer and the frame may be applied to the tape to which both of the tension forces are given.

The present invention has the following advantages.

Namely, it is prevented that alignment of the semiconductor chips, which are cut off in a die-cutting process, is disordered. The positions of the semiconductor chips can be surely detected by means of a pick-up machine in a pick-up process after the die-cutting process, and therefore interruption of the producing processes due to non-detection of the positions of the semiconductor chips, may be detected.

In the present invention, where the driving device of the lateral tension device synchronously moves both clamps in opposite directions, it may give a tension force in the cross-web direction to the tape without shifting the center line of the tape to the cross-web direction. Therefore, it becomes possible to surely prevent alignment of the semiconductor chips from disordering after the die-cutting process.

Further, in the present invention, where the driving device of the lateral tension device provides the tension force setter which varies the amount of open or close of both clamps, the best tension force may be given to the tape by varying the amount of open or close of both clamps corresponding to a kind of the tape. As the result, a plural kinds of the tape, which are different in adhesiveness and tension strength, can be used.

In the present invention, where the driving device of the lateral tension device provides a screw shaft which extends in a cross-web direction, and which is formed with a left-hand thread at an end thereof and also a right-hand thread at another end thereof, and a motor for driving the screw shaft, said left-hand thread of the screw shaft being movably threaded into one of the clamp means and said right-hand thread being movably threaded into the other clamp means, it becomes possible to adjust the tension force within a range of, for example, about 50–200 Kg with a simple construction. Therefore, it may use a low price tape which is strong in adhesiveness and tension force.

Further, where the clamp means provides a pair of clamp beams for clamping both the edges of the tape in a cross-web direction for a predetermined length from both sides thereof in a direction of thickness, the clamp surfaces of the clamp means facing to each other being formed convex and concave, it becomes possible to surely clamp both side edges of the tape in the cross-web direction. Therefore, it may use a low price tape, which is strong in adhesiveness and tension force, by increasing a maximum tension force which is given to the tape.

Furthermore, the vertical tension device may provide a fixed position roller and a movable roller which are arranged parallel to each other above the semiconductor wafer and a frame, leaving a predetermined distance in a down-web direction, which distance is longer than the length of the frame, fixed position clamp means contacting with and moving away from the fixed position roller, movable clamp means contacting with and moving away from the movable roller, and drive means for moving the movable roller and the movable clamp means in a down-web direction, and further comprising tension force setting means for variably setting a moving amount of each of the movable roller and the movable clamp.

In this case, the tension force in the down-web direction not only corresponds to a kind of the tape but also to the tension force in the cross-web direction given by the lateral tension device. Therefore, a difference between the tension force in the down-web direction and that in the cross-web direction may be surely minimized or eliminated, and it may surely prevent the spaces or intervals among the semiconductor chips, which are cut off in the die-cutting process, from becoming uneven.

Further, where the drive means of the lateral tension device provides a screw shaft which is threadedly inserted into a screw hole formed with a movable frame for supporting the movable roller and the movable clamp, and a motor for rotating the screw shaft, it may obtain a strong output with a compact and simple construction and it may easily control the tension force in the down-web direction with a high precision. As the result, it may surely solve a problem occurring in a difference between the tension force in the down-web direction and that in the cross-web direction, and therefore it may prevent that the spaces or intervals among the semiconductor chips, which are cut off in the die-cutting process, become uneven.

Other objects and advantages of the present invention will be apparent from the following description of the embodiment accompanying the drawings.

BRIEF DESCRIPTION OF THE DRAWINGS

The drawings show an embodiment of a semiconductor producing apparatus having a tape extension device according to the present invention in which.

DETAILED DESCRIPTION OF THE EMBODIMENT

An embodiment of the present invention will be described in detail hereinbelow with reference to the drawings, but the present invention cannot be limited to the embodiment.

Figure 1:
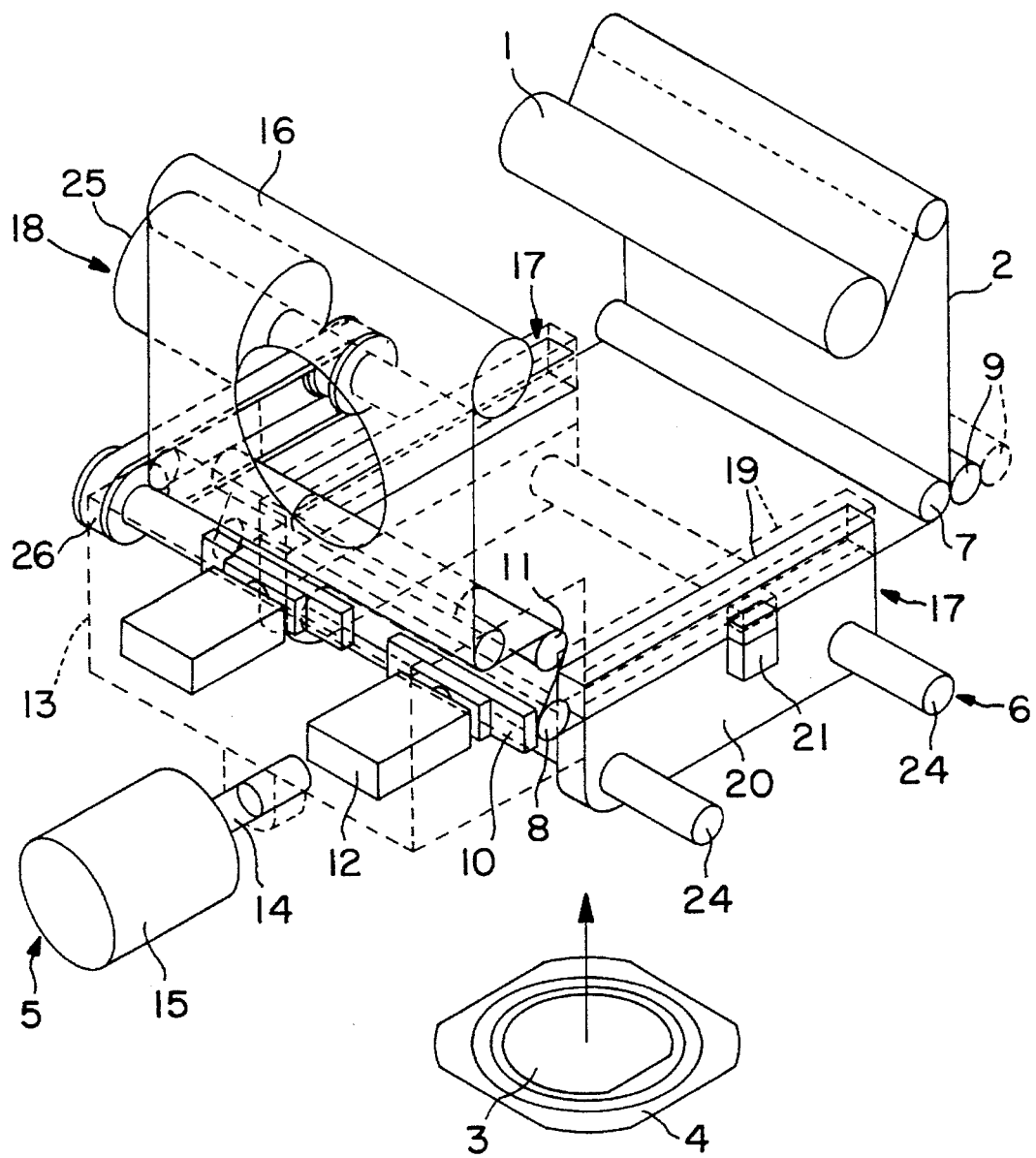
FIG. 1 is a perspective view of the apparatus of the present invention.

As shown in FIG. 1, a semiconductor producing apparatus of an embodiment of this invention provides a vertical tension device 5 which tenses a tape 2, which is drawn from a tape roll 1, in a down-web direction above a semiconductor wafer 3 and a frame 4, and a lateral tension device 6 which tenses the tape 2 in a cross-web direction. The down-web direction means the direction of flow of the tape or the direction of transfer of the tape, and the cross-web direction means the direction of width of the tape.

The vertical tension device 5 is constructed as a conventional tape extension device and comprises a fixed position roller 7 which is rotatably positioned about a lateral axis in the down-web direction, and a moving roller 8 which is rotatably arranged in parallel with the fixed position roller 7, leaving, in the down-web direction, a distance longer than the frame 4.

A counter roller 9 is arranged on the side of the fixed position roller 7 opposite to the moving roller 8, so as to be close to and apart from the fixed position roller 7. Further, a clamp pad 10 is arranged on the side of the fixed position roller 7 opposite to the fixed position roller 7, so as to be close to and apart from the moving roller 8. A drum roller 11 is arranged above the moving roller 8, said drum roller having a middle portion of small diameter.

The moving roller 8, the drum roller 11, the clamp pad 10 and a cylinder 12 for driving the clamp pad 10, are supported by a moving frame 13, and a stepping motor 15 reciprocates the moving frame 13 in the down-web direction via a screw 14 in such a state that the screw is screwed with a screwed hole which is formed with the moving frame 13.

The tape 2 is withdrawn from the tape roll 1, passing between the fixed position roller 7 and the counter roller 9, and transferred laterally. Then, the tape 2 goes through the moving roller 8 and the clamp pad 10 from the underside of the moving roller 8, so as to be wound on a winding roll 16 via the drum roller 11.

Rotations of the tape roll 2, the wound roller 16 and the fixed roller 7 are stopped at a predetermined timing and transfer of the tape is then stopped by clamping the tape by means of the counter roller 9 and the fixed roller 7. At the same time or thereafter, the moving roller 8 stops its rotation and the tape 2 is clamped between the clamp pad 10 and the moving roller 8.

Thereafter, a tension force in the down-web direction is given to the tape 2 by moving the clamp pad 10 for clamping the tape 2, and also moving the moving roller 8 away from the fixed position roller 7.

Since the tension force of the tape 2 can be adjusted by a moving amount of each of the clamp pad 10 and the moving roller 8 and also a kind of the tape 2, it is so constructed that the best tension force (for example, about 50~200 Kg) in the down-web direction corresponding to the kind of the tape can be given by controlling a value of each of the moving amounts of the clamp pad 10 and the moving roller 8 in the down-web direction by means of a control device including a micro-computer.

The control values suitable for each of the tapes are memorized previously in the micro-computer of the control device, so that the best control value may be selected corresponding to the tape by giving a signal to the micro-computer for discriminating the kind of the tape. However, it may control the moving amounts of the clamp pad 10 and the moving roller 8 by directly inputting the best control value, which corresponds to the tape to be used, into the micro-computer. In the present invention, a torque limiter is interposed between the stepping motor 15 and the screw 14 for varying limited set value without relying on such a value control. Accordingly, it becomes possible to set a tension force mechanically so as to adjust a tension force in the down-web direction which is given to the tape, by adjusting a limitting value to correspond to the best value of the tension for the tape 2.

The lateral tension device 6 comprises a pair of clamps 17 which are arranged to face each other between the fixed position roller 7 and the moving roller 8, and a driving device 18 for opening and closing each of the clamps 17.

Each of the clamps 17 prevents the tape 2 from breaking and it is preferable to clamp the side edges of the tape 2 as long as possible in the down-web direction for averaging a tension force in the cross-web direction of the tape 2 with respect to the down-web direction.

For the purpose, the clamp 17 in this embodiment comprises a pair of upper and lower clamp beams 19 and 20 and an aircylinder 21 for rising and lowering the upper clamp beam 19 with respect to the lower clamp beam 20. Each of the clamp beams 19 and 20 clamps both of the side edges of the tape 2 by the vertical tension device 5 above the semiconductor wafer from the upper and lower sides of the tape for a predetermined long length which is longer than the frame 3. In this case, the length is about 1.2 to 1.5 times of the frame.

Figure 2:
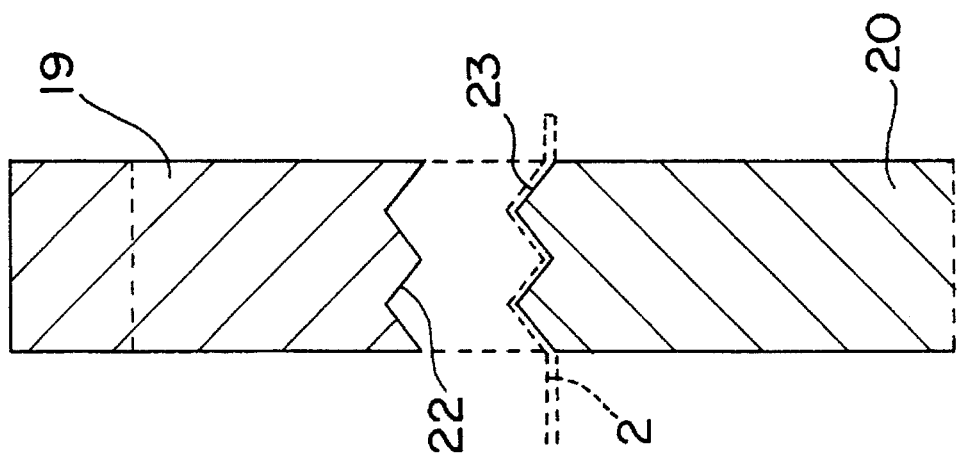
FIG. 2 is a sectional view of clamp beams of the present invention.
Figure 3:
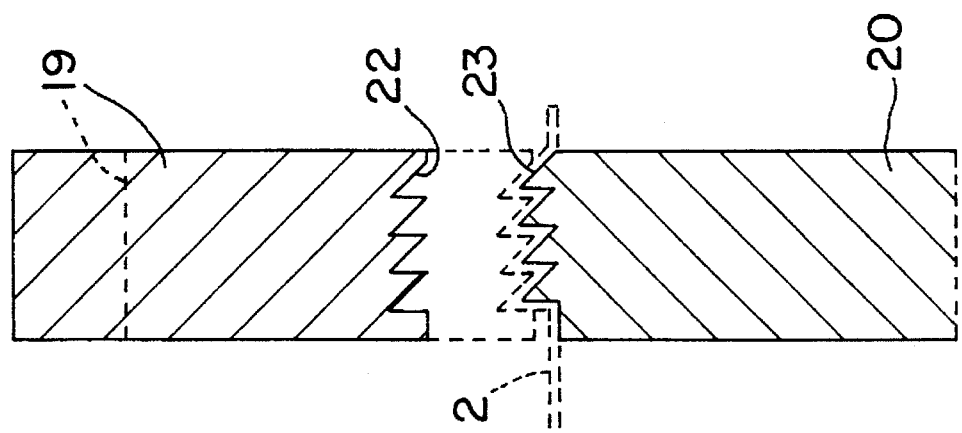
FIG. 3 is a sectional view of clamp beams of another aspect of the present invention.
Figure 4:
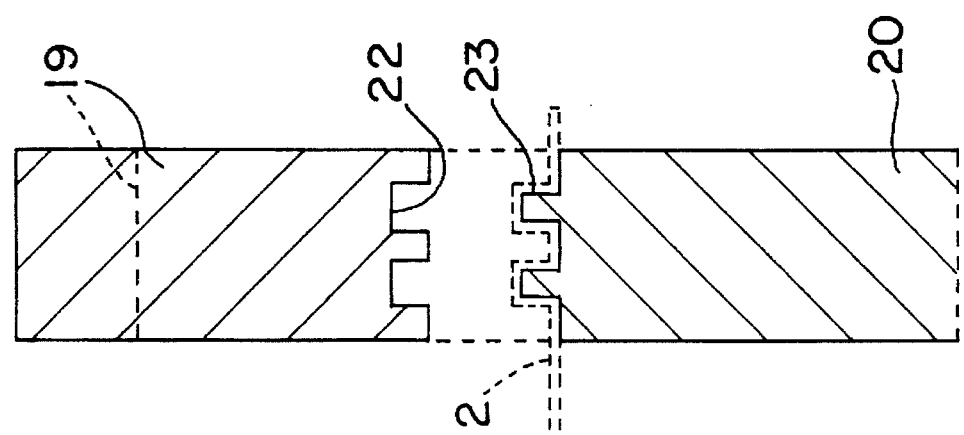
FIG. 4 is a sectional view of clamp beams of a further aspect of the present invention.
Figure 5:
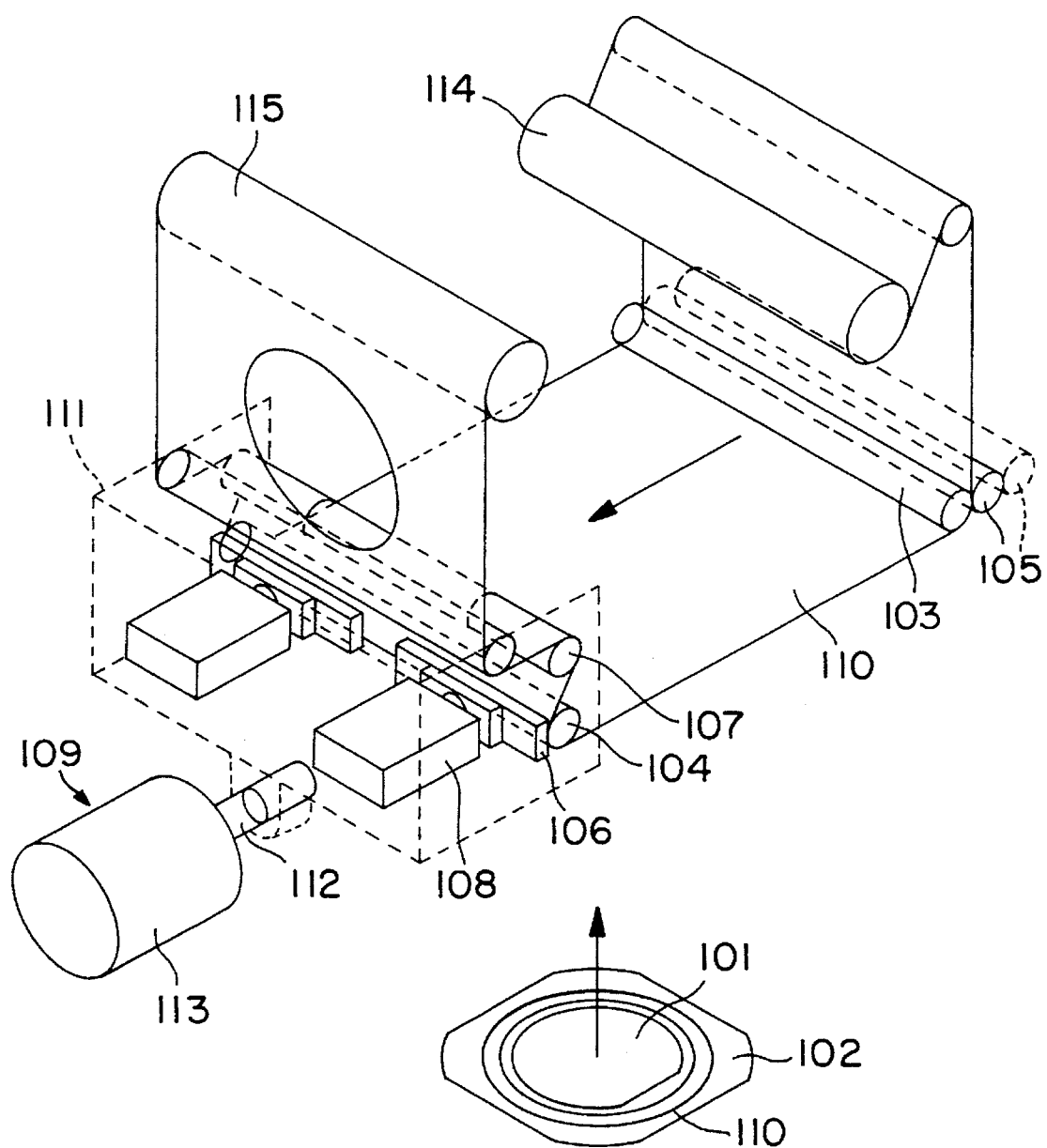
FIG. 5 is a perspective view of a conventional apparatus of the prior art.

The clamping surfaces of the clamp beams 19 and 20, which are faced to each other, may be formed to be flat and smooth friction surfaces. However, in this embodiment, it is preferable that the clamp surfaces 22 and 23 are formed to be rectangular wave sections which may engage with each other and also formed to be concave and convex surfaces which extend to the down-web direction, in order to give a strong tension force to the tape by clamping the tape surely, as shown in FIG. 2. Further, as shown in FIG. 3, the clamp surfaces are formed to have sections in the teeth like shape and also formed to be a stripe which extends to the direction of the down-web direction. As shown in FIG. 4, the clamp surfaces may be formed to have triangular wave sections and formed to be concave and convex stripe surfaces which extend to the down-web direction.

In this embodiment, as shown in FIG. 2, the clamp surfaces are formed to have concave and convex stripe surfaces having the sections of rectangular and wave shapes which surfaces extend to the down-web direction, in order to surely prevent the tape 2 from slipping out between the clamp surfaces 22 and 23 due to the strong tension force.

The driving device 18 comprises a screw shaft 24 which has a left screw at an end thereof and a right screw at another end thereof, and a stepping motor 25 for driving the screw shaft 24, wherein the left screw of the screw shaft 24 is screwed into the clamp 17 and the right screw is screwed into the other clamp 17.

The screw shaft 24 may be single or plural. In this embodiment, two screw shafts 24 are arranged parallelly leaving a suitable distance therebetween in the down-web direction and driven synchronously via a synchronizing device 26, in order to increase accuracy of control by moving both of the clamps 17 smoothly and simplifying its construction.

While the tape 2 is transferred and the moving roller 8 and the clamp pad 10 are moving away from the fixed position roller 7, the upper clamp beam 19 is remote away from the lower clamp beam 20 by expanding the aircylinder 21.

Within the period of the above actions or prior to the period, both of the clamps 17 are driven by the driving device 18 so as to position the side edges of the tape 2 between the upper clamp beam 19 and the lower clamp beam 20. After finishing the tension of the tape 2 in the down-web direction by means of the vertical tension device 5, the aircylinder 21 is retracted so as to lower the upper clamp means 19, and then the side edges of the tape 2 are clamped between the upper clamp beam 19 and the lower clamp beam 20.

Further, after the above process, the driving device 18 drives both of the clamps 17 in the direction that the clamps are remote away from each other. When both of the clamps 17 are moved for a predetermined distance, the driving device 18 is controlled to stop so that a tension force in a clamping direction is given to the tape 2, which tension force is substantially equal to the down-web direction (for example, about 50–200 Kg).

Since the tension force of the tape 2 may be adjusted according to a kind of the tape and the moving amount of both clamps 17, the best tension force of the cross-web direction corresponding to the kind of the tape may be given to the tape by means of a control device including a micro-computer, so as to control the rotation of the stepping motor 25.

Best control values suitable for all kinds of the tape are memorized previously in the micro-computer of the control device. Therefore, the best control value suitable for the tape is selected by inputting in the micro-computer a signal for discriminating the kind of the tape. However, instead of using the previously input values, the best value corresponding to the tape is input directly to the micro-computer, so that the rotation of the stepping motor may be controlled with a value control.

In the present invention, a torque limiter is interposed between the stepping motor 25 and the screw 24 for varying a limited set value without relying on such a value control. Accordingly, it becomes possible to set a tension force mechanically so as to adjust a tension force in the down-web direction which is given to the tape, by adjusting a limitting value to correspond to the best value of tension for the tape 2.

Since both clamps 17 are driven synchronously in opposite directions, a tension force in the cross-web direction may be given to the tape 2 without shifting the center line of the tape 2 in the cross-web direction to the cross-web direction.

After both clamps 17 are opened, the semiconductor wafer 3 and the frame 4 rise to lift the tape 2 slightly. Then, the tape 2 is pressed down onto the semiconductor wafer 3 and the frame 4 by means of a roller, so that the tape 2 is applied to the semiconductor wafer 3 and the frame 4. Thereafter, the tape 2 is cut off in a circular shape so as to cover the inner peripheral portion of each of the semiconductor wafer 3 and the frame 4.

After applying the tape 2 to the semiconductor wafer 3 and the frame 4, the semiconductor wafer 3 and the frame 4 are lowered and then the upper clamp beams 19 of the both clamps 17 are rised so as to release the tape 2 from both clamps 17, and the counter roller 9 is remote from the fixed position roller 7 of the counter roller 9, so that the tape 2 is wound on the winding roller 16.

In a die-cutting process for the semiconductor wafer 3 and the frame 4 to which the tape 2 is applied, since the tension force of the down-web direction given to the tape 2 is controlled substantially equal to the tension force of the cross-web direction, it is not afraid that the spaces among the cut semiconductor wafers becomes uneven. Further, since the position of the semiconductor wafer can be surely detected when the semiconductor wafer is removed by means of a pick-up machine after the die-cutting process, interruption of the producing process due to impossible of detection of the position cannot be evaded.

The claimed invention should be understood considering the following notes:

The tape used in this invention is applied to both of the semiconductor wafer and the plate-like die frame surrounding the semiconductor wafer, and the tape comprises a film such as plastic resin or cellophane and an adhesive layer provided with a surface of the film.

The semiconductor wafer is set on an elevator table in such a state that the semiconductor wafer is so positioned to place its semiconductor connecting construction downwards, and that the semiconductor wafer is positioned coaxial with the frame.

It is sufficient that the vertical tension device may tense the tape, which is drawn from the tape roller, above the semiconductor-wafer in a down-web direction. For instance, the vertical tension device may be the same as a conventional extension device including the above-mentioned prior art.

For example, the vertical tension device may comprise a fixed positioned roller and a moving roller which are positioned parallelly spacing a predetermined length therebetween in a down-web direction above the semiconductor-wafer and the frame, said length being longer than the length of the frame, fixed position clamp means capable of contacting with and separating from the fixed position roller, moving clamp means capable of contacting with and separating from the moving roller, and a driving device for driving the moving roller and the moving clamp means forwards and rearwards in a down-web direction.

The tension force given to the tape by the vertical tension device may be set constant, but it is preferable to adjust the tension force suitably relative to a tensile strength of any kind of tapes having a different tensile strength. Therefore, in the above vertical tension device, it is preferable to provide tension force setting means which may vary an amount of movement of each of the moving roller and the moving clamp means, and adjust the moving amount of each of the moving roller and the moving clamp means according to a kind of the tape, so that a suitable tension force can be given to the tape.

In this case, it is preferable to precisely control an amount of movement of each of the moving roller and the moving clamp means. For that, it may recommend that the driving device comprises a moving frame supporting the moving roller and the moving clamp, a screw shaft which is screwed into a screw hole formed with the moving frame and a motor for rotating the screw shaft.

It is sufficient that the lateral tension device is so constructed as to tense the tape, which is tensed in a down-web direction by means of the vertical tension device, in a cross-web direction which is vertical to the down-web direction. For that, the lateral tension device has to provide a clamp device for clamping a side edge of the tape in the cross-web direction, another clamp device for clamping another side edge of the tape and a driving device for opening and closing a pair of these clamp devices.

As a method of opening and closing both of the clamp devices by means of the driving device, two systems may be proposed. One is that one of the clamp device is fixed so that the driving device moves the other clamp device, and another is that the driving device moves both of the clamp devices.

In the case of the present invention, either of the manners may be adopted. In the method of fixing one of the clamp devices and moving the other clamp device by means of the driving device, the tape is tensed at a side edge while fixing the tape in three directions. As the result, the tension force cannot be averaged perfectly in two dimensions, and a line of the semiconductor chips cut off in a die-cutting process, is shifted greatly to a side, so that the cutting positions of the semiconductor chips sometimes cannot be detected by means of a die machine.

Therefore, in this invention, it is preferable to adopt the method of moving both of the clamp devices by the driving device, and particularly, it is more preferable that the driving device move both of the clamp devices synchronously in opposite directions to each other.

Further, in the case of this invention, it is preferable to adjust an output of the driving device, namely a tension force given to the tape in the cross-web direction according to a thickness of the tape and its width and therefore it is preferable to provide regulating means for adjust the output of the driving device.

Where both of the clamp devices are moved synchronously in opposite directions to each other, it may eliminate a shift of the semiconductor chips at the time of a dieing-process. The reason is supposed such that the tape is tensed in such a state that a center line of the tape is the cross-web direction is not moved towards the cross-web direction, and that the tension force may be equally given to the down-web direction and the cross-web direction where the center of the semiconductor wafer is set as a center of the tension force.

As the driving device for moving both of the clamp devices synchronously in opposite directions to each other, it may adopt an oil operated cylinder or an air operated cylinder.

However, in the case of the oil cylinder or the air cylinder, it is difficult to carry out a precise speed control and also a precise output control according to a tensile strength of the tape which is actually used. Particularly, it is difficult to carry out a digital control of high precision. In view point of this, the oil operated cylinder or the air operated cylinder cannot be recommended.

Further, in the case of the oil operated cylinder, it is not preferable since the semiconductor wafer, the frame and the tape are sometimes stained with oil. Also, in the case of the air operated cylinder, it is not preferable to necessitate a block for an air vent.

As the driving device, a linear solenoid may be used, but it is disadvantageous in forming a compact apparatus since a large-sized of the linear solenoid has to be used for obtaining a high power greater than the power of 50 Kg, as required in the vertical tension device.

Further, it is possible to comprise the driving device by cams for driving both of the clamps, an operative mechanism for actuating the cams, and a motor, but it is difficult that such a driving device cannot obtain a sufficient output without a torque multiplying mechanism. Further, such a driving device is not preferable since accuracy of synchronism due to wear of the cams as well as decrease of the output may be easily occurred. Furthermore, it is difficult to carry out precise control of the output corresponding to a tension force of the tape which is used.

In conclusion, it is suitable, in this invention, to adopt such a construction which comprises the driving device by a screw shaft which extends in a cross-web direction and has a left screw at an end of the screw shaft and a right screw at another end thereof, and a motor for driving the screw shaft, wherein the left screw of the screw shaft is rotatably screwed into a clamp and the right screw thereof is rotatably screwed into another clamp.

The screw shaft may consist of a single shaft or plural shafts which are arranged in parallel to one another, and these shafts may be in synchronim with one another by using a synchronizing mechanism such as a belt having teeth or gears.

In the case of providing a single screw shaft, a guide or a plurality of guides more than two, may be arranged in parallel to these screw shafts in order to stabilize the movement of both of the clamps by guiding the clamps.

Contrary to this, in the case of providing a plurality of screw shafts, it may omit such a guide shaft since each of the screw shafts functions as a guide.

According to the driving device having the screw shaft and the motor, it becomes possible to control the positions of the clamps easily and precisely corresponding to a tension force of the tape by controlling the space between both of the clamps by means of a digital control.

Further, in the case of controlling both of the clamps by means of the screw shaft, it is possible to give a tension force of about 200 Kg to the tape, so that it becomes possible to use a tape of low price which has a strong adhesion but lacks a stable adhesive force. This means that the producing cost of semiconductor parts may be reduced.

As the adjusting means for variably setting a tension force of the tape, it is possible to use a mechanical torque limitter which may variably set a limitted torque. However, it is preferable to use a stepping motor which counts precise rotation angles as a driving motor, so that it may easily control its adjusting operation of the adjusting means and increase its adjusting precision.

As the result, it is possible to adjust the amount of rotation of the motor, namely the amounts of movement of the clamps corresponding to a kind of the tape.

In this case, the control values of the motor corresponding to some of the tapes are memorized in a micro-computer in advance, and a signal for selecting a kind of tape is input to the micro-computer, so that the best control value may be selected automatically. Also, it is possible to input the control values to the micro-computer, which values correspond to any kinds of the tapes.

Each of the clamps prevents the tape from cutting, and may be constructed to clamp the edge of the tape as long as possible in the down-web direction in order to average a tension force of the tape in the cross-web direction with respect to the down-web direction of the tape.

Therefore, it is preferable to provide each of the clamps with a pair of clamp beams which clamps both edges in the cross-web direction of the tape from the directions of thickness, for a length preferably longer than the length of the frame, said tape being tensed by means of the vertical tension device in the down-web direction above the semiconductor wafer.

Each of the clamping surfaces of the clamps may be formed to have a smooth friction surface, but it is advantageous that the clamping surfaces are formed to have concave and convex surfaces which may engage with each other so as to clamp the tape surely, so that it may give a strong tension force to the tape.

In the case of forming the clamping surfaces to be concave and convex, it is preferable to form the clamping surface to be stripe concave and convex surfaces which extend in the down-web direction, so that the tape may be prevented from slipping between the clamping surfaces due to the strong tension force.

As the sectional concave and convex shapes of the clamp surfaces, it may use such as a triangular wave shape, a saw teeth shape, or a rectangular wave shape, but among them it may recommend to use the rectangular wave shape which is easy in manufacturing and prevents the tape from easily slipping out between the clamp surfaces.

It may propose that each of the clamps comprises two splined shafts which are engaged with each other wherein both side edges of the tape are engaged between the splined shafts so as to give a tension force in the cross-web direction to the tape by rotating each of the splined shafts of the clamps synchronously. According to this construction, however, it is very difficult to grade the precision of synchronism of the splined shafts, and the center line of the tape tends to shift in the cross-web direction. Further, it is disadvantageous in levelling safety.

In the present invention, it is possible to construct the vertical tension device to synchronously pull the tape in the directions of both sides thereof in such a state that the semiconductor wafer and the frame are centers with respect to the tape. In this case, it is possible to construct the device such that the vertical tension device pulls the tape in the down-web direction and at the same time the lateral tension device pulls the tape in the cross-web direction.

In the case that the vertical tension device synchronously pulls the tape in the directions of both sides thereof in such a state that the semiconductor wafer and the frame are centers with respect to the tape, it is possible to construct the device such that after the lateral tension device pulls the tape in a direction of the cross-web direction so as to give a tension force of the down-web direction to the tape, the vertical tension device synchronously pulls the tape in the down-web direction so as to give a tension force of the down-web direction to the tape.

The semiconductor producing apparatus of the present invention provides the above-mentioned tape extension device in order to achieve the above-mentioned objects.

The foregoing relates to preferred exemplary embodiments of the invention, it being understood that other variants and embodiments thereof are possible within the spirit and scope of the invention, the latter being defined by the appended claims.

What is claimed is:

1. A tape extension apparatus for use in applying a tape over a semiconductor wafer in manufacture of semiconductor wafers including a first frame for supporting a semiconductor wafer horizontally below said tape, longitudinal tension means for horizontally extending said tape maintained in a fixed position over said first frame in a down web direction of said tape, and means for pressing said tape and said semiconductor wafer against each other for cohesion, said tape extension apparatus comprising:

transverse tension means having two pairs of horizontal clamps with each clamp of each pair movable in opposing vertical directions parallel with each other for clamping said tape along edges of opposite sides for applying a tension on the tape in a cross web direction of said tape above said first frame, and transverse drive means for driving said pairs of clamps in the cross web direction to open and close a space therebetween after said clamps clamp said tape and a tape has been applied to said semiconductor wafer.

2. A tape extension apparatus according to claim 1, wherein said transverse drive means includes means for synchronously driving said clamps in opposite directions.

3. A tape extension apparatus according to claim 1, further comprising means for adjusting tension of said tape in the cross web direction by adjusting a furthermost limit to movement of said clamps relative to each other.

4. A tape extension apparatus according to claim 2, further comprising means for adjusting tension of said tape in the cross web direction by adjusting a furthermost limit to movement of said clamps relative to each other.

5. A tape extension apparatus according to claim 1, wherein said transverse drive means includes a screw shaft extending in the cross web direction, said screw shaft having a left male screw formed at one end thereof and a right male screw formed at another end thereof, a motor for driving said screw shaft, a left female screw formed in one of said clamps of each of said two pairs of clamps and engaged with said left male screw, and a right female screw formed in another of each of said pair of clamps and engaged with said right male screw.

6. A tape extension apparatus according to claim 2, wherein said transverse drive means includes a screw shaft extending in the cross web direction, said screw shaft having a left male screw formed at one end thereof and a right male screw formed at another end thereof, a motor for driving said screw shaft, a left female screw formed in one of said clamps of each of said two pairs of clamps and engaged with said left male screw, and a right female screw formed in another of each of said pair of clamps and engaged with said right male screw.

7. A tape extension apparatus according to claim 3, wherein said transverse drive means includes a screw shaft extending in the cross web direction, said screw shaft having a left male screw formed at one end thereof and a right male screw formed at another end thereof, a motor for driving said screw shaft, a left female screw formed in one of said clamps of each of said two pairs of clamps and engaged with said left male screw, and a right female screw formed in another of each of said pair of clamps and engaged with said right male screw.

8. A tape extension apparatus according to claim 1, wherein each of said clamps includes at least one pair of clamp beams disposed above and below one of said opposite sides of said tape for clamping said tape, each clamp beam having an uneven clamping surface for contacting opposite surfaces of said tape.

9. A tape extension apparatus according to claim 2, wherein each of said clamps includes at least one pair of clamp means disposed above and below one of said opposite sides of said tape for clamping said tape, each clamp mean having an uneven clamping surface for contacting opposite surfaces of said tape.

10. A tape extension apparatus according to claim 3, wherein each of said clamps includes at least one pair of clamp means disposed above and below one of said opposite sides of said tape for clamping said tape, each clamp mean having an uneven clamping surface for contacting opposite surfaces of said tape.

11. A tape extension apparatus according to claim 4, wherein each of said clamps includes at least one pair of clamp means disposed above and below one of said opposite sides of said tape for clamping said tape, each clamp mean having an uneven clamping surface for contacting opposite surfaces of said tape.

12. A tape extension apparatus according to claim 1, wherein said longitudinal tension means includes:

a stationary roller disposed above and laterally outwardly of a second frame to be rotatable about an axis extending in said cross web direction;

at least one stationary clamping member movable toward and away from said stationary roller for clamping said tape with said stationary roller,
- a movable roller disposed laterally outwardly of said second frame and opposed and parallel to said stationary roller to be movable toward and away from said stationary roller;

at least one movable clamping member movable toward and away from said movable roller for clamping said tape with said movable roller;

longitudinal drive means for driving said movable roller and said movable clamping member toward and away from said stationary roller; and means for adjusting tension of said tape in said down web direction by adjusting a furthermost limit to movement of said movable roller and said movable clamping member relative to said stationary roller.

13. A tape extension apparatus according to claim 2, wherein said longitudinal tension means includes:

a stationary roller disposed above and laterally outwardly of a second frame to be rotatable about an axis extending in said cross web direction;

at least one stationary clamping member movable toward and away from said stationary roller for clamping said tape with said stationary roller,
- a movable roller disposed laterally outwardly of said second frame and opposed and parallel to said stationary roller to be movable toward and away from said stationary roller;

at least one movable clamping member movable toward and away from said movable roller for clamping said tape with said movable roller;

longitudinal drive means for driving said movable roller and said movable clamping member toward and away from said stationary roller; and means for adjusting tension of said tape in said down web direction by adjusting a furthermost limit to movement of said movable roller and said movable clamping member relative to said stationary roller.

14. A tape extension apparatus according to claim 3, wherein said longitudinal tension means includes:

a stationary roller disposed above and laterally outwardly of a second frame to be rotatable about an axis extending in said cross web direction;

at least one stationary clamping member movable toward and away from said stationary roller for clamping said tape with said stationary roller,
- a movable roller disposed laterally outwardly of said second frame and opposed and parallel to said stationary roller to be movable toward and away from said stationary roller;

at least one movable clamping member movable toward and away from said movable roller for clamping said tape with said movable roller;

longitudinal drive means for driving said movable roller and said movable clamping member toward and away from said stationary roller; and means for adjusting tension of said tape in said down web direction by adjusting a furthermost limit to movement of said movable roller and said movable clamping member relative to said stationary roller.

15. A tape extension apparatus according to claim 4, wherein said longitudinal tension means includes:

a stationary roller disposed above and laterally outwardly of a second frame to be rotatable about an axis extending in said cross web direction;

at least one stationary clamping member movable toward and away from said stationary roller for clamping said tape with said stationary roller,
- a movable roller disposed laterally outwardly of said second frame and opposed and parallel to said stationary roller to be movable toward and away from said stationary roller;

at least one movable clamping member movable toward and away from said movable roller for clamping said tape with said movable roller;

longitudinal drive means for driving said movable roller and said movable clamping member toward and away from said stationary roller; and means for adjusting tension of said tape in said down web direction by adjusting a furthermost limit to movement of said movable roller and said movable clamping member relative to said stationary roller.

16. A tape extension apparatus according to claim 5, wherein said longitudinal tension means includes:

a stationary roller disposed above and laterally outwardly of a second frame to be rotatable about an axis extending in said cross web direction;

at least one stationary clamping member movable toward and away from said stationary roller for clamping said tape with said stationary roller,
- a movable roller disposed laterally outwardly of said second frame and opposed and parallel to said stationary roller to be movable toward and away from said stationary roller;

at least one movable clamping member movable toward and away from said movable roller for clamping said tape with said movable roller;

longitudinal drive means for driving said movable roller and said movable clamping member toward and away from said stationary roller; and means for adjusting tension of said tape in said down web direction by adjusting a furthermost limit to movement of said movable roller and said movable clamping member relative to said stationary roller.

17. A tape extension apparatus according to claim 6, wherein said longitudinal tension means includes:

a stationary roller disposed above and laterally outwardly of a second frame to be rotatable about an axis extending in said cross web direction;

at least one stationary clamping member movable toward and away from said stationary roller for clamping said tape with said stationary roller,
- a movable roller disposed laterally outwardly of said second frame and opposed and parallel to said stationary roller to be movable toward and away from said stationary roller;

at least one movable clamping member movable toward and away from said movable roller for clamping said tape with said movable roller;

longitudinal drive means for driving said movable roller and said movable clamping member toward and away from said stationary roller; and means for adjusting tension of said tape in said down web direction by adjusting a furthermost limit to movement of said movable roller and said movable clamping member relative to said stationary roller.

18. A tape extension apparatus according to claim 12, wherein said longitudinal tension means further includes a movable second frame movable in said down web direction for supporting said movable roller and said moving clamp means, said longitudinal drive means having a longitudinal screw shaft extending in said down web direction, a threaded bore formed in said movable second frame and engaged with said longitudinal screw shaft, and a motor for driving said longitudinal screw shaft.

19. A tape extension apparatus according to claim 13, wherein said longitudinal tension means further includes a movable second frame movable in said down web direction for supporting said movable roller and said moving clamp means, said longitudinal drive means having a longitudinal screw shaft extending in said down web direction, a threaded bore formed in said movable second frame and engaged with said longitudinal screw shaft, and a motor for driving said longitudinal screw shaft.

20. A tape extension apparatus according to claim 14, wherein said longitudinal tension means further includes a movable second frame movable in said down web direction for supporting said movable roller and said moving clamp means, said longitudinal drive means having a longitudinal screw shaft extending in said down web direction, a threaded bore formed in said movable second frame and engaged with said longitudinal screw shaft, and a motor for driving said longitudinal screw shaft.

21. A tape extension apparatus according to claim 15, wherein said longitudinal tension means further includes a movable second frame movable in said down web direction for supporting said movable roller and said moving clamp means, said longitudinal drive means having a longitudinal screw shaft extending in said down web direction, a threaded bore formed in said movable second frame and engaged with said longitudinal screw shaft, and a motor for driving said longitudinal screw shaft.

22. A tape extension apparatus according to claim 16, wherein said longitudinal tension means further includes a movable second frame movable in said down web direction for supporting said movable roller and said moving clamp means, said longitudinal drive means having a longitudinal screw shaft extending in said down web direction, a threaded bore formed in said movable second frame and engaged with said longitudinal screw shaft, and a motor for driving said longitudinal screw shaft.

23. A tape extension apparatus according to claim 6, wherein said longitudinal tension means includes:
- a stationary roller disposed above and laterally outwardly of said second frame to be rotatable about an axis extending in said cross web direction;
- at least one stationary clamping member movable toward and away from said stationary roller for clamping said tape with said stationary roller,
- a movable roller disposed laterally outwardly of said second frame and opposed and parallel to said stationary roller to be movable toward and away from said stationary roller;
- at least one movable clamping member movable toward and away from said movable roller for clamping said tape with said movable roller;
- a movable third frame movable in said down web direction for supporting said movable roller and said moving clamp means;

longitudinal drive means for driving said movable third frame to move said movable roller and said movable clamping member toward and away from said stationary roller; and means for adjusting tension of said tape in said down web direction by adjusting a furthermost limit to movement of said movable roller and said movable clamping member relative to said stationary roller;

said longitudinal drive means having a longitudinal screw shaft extending in said down web direction, a threaded bore formed in said movable third frame and engaged with said longitudinal screw shaft, and a motor for driving said longitudinal screw shaft.

24. A tape extension apparatus according to claim 17, wherein said longitudinal tension means further includes a movable third frame movable in said down web direction for supporting said movable roller and said moving clamp means, said longitudinal drive means having a longitudinal screw shaft extending in said down web direction, a threaded bore formed in said movable third frame and engaged with said longitudinal screw shaft, and a motor for driving said longitudinal screw shaft.

25. A tape extension device for applying a tape covering onto a semiconductor wafer in a semiconductor producing apparatus which has a frame for holding a semiconductor wafer thereon horizontally, a vertical extension device for extending a tape being laid still over said frame horizontally in a down web direction of said tape, and means for pressing at least one of said tape and said semiconductor wafer being held by said frame against the other one to adhere them together, comprising:
- a lateral tension device having a pair of clamp means disposed parallel to one another for clamping said tape positioned over said frame horizontally along each side in a cross web direction of said tape, said tape being tensioned parallel in the cross direction of said tape,
- and a lateral drive means for moving said clamp means in parallel in the cross web direction of said tape to open and close a spacing between said pair of clamp means after they have clamped said tape at either side portion thereof.

26. A tape extension apparatus for use in manufacturing semiconductor wafers comprising a first frame for supporting a semiconductor wafer horizontally, longitudinal tension means for horizontally extending a tape maintained in a fixed position over said first frame in a down web direction of said tape, and means for pressing said tape and said semiconductor wafer against each other for cohesion,
- transverse tension means having two pairs of clamps for clamping said tape on opposite sides in a cross web direction of said tape above said first frame, and transverse drive means for driving said clamps in the cross web direction to open and close a space therebetween after said clamps clamp said tape.

* * * * *